United States Patent [19]

Bruno

[11] 4,298,680

[45] Nov. 3, 1981

[54] METHOD AND APPARATUS FOR MANUFACTURING SEAMLESS PRINTING ROLL

[75] Inventor: Vogel Bruno, Einbec, Fed. Rep. of Germany

[73] Assignee: N.V. APR Europe S.A., Brussels, Belgium

[21] Appl. No.: 108,096

[22] Filed: Dec. 28, 1979

[30] Foreign Application Priority Data

Feb. 14, 1979 [JP] Japan ............................. 54-15824

[51] Int. Cl.³ .................. G03C 5/00; G03B 27/04; G03B 27/22
[52] U.S. Cl. ......................... 430/300; 101/401.1; 101/456; 101/457; 355/85; 355/104; 355/109; 355/110; 430/306; 430/327; 430/935; 430/494
[58] Field of Search .............. 430/300, 306, 327, 307, 430/935, 494; 101/401.1, 456, 457; 355/85, 104, 109, 110, 108

[56] References Cited

U.S. PATENT DOCUMENTS

| 3,126,808 | 3/1964 | Kaulen | 355/110 |
| 3,294,889 | 12/1966 | Downie et al. | 430/360 |
| 4,143,190 | 3/1979 | Choinski | 430/935 X |

Primary Examiner—Edward C. Kimlin
Attorney, Agent, or Firm—Sughrue, Mion, Zinn, Macpeak & Seas

[57] ABSTRACT

Method and apparatus for manufacturing a seamless printing roll. A liquid photosensitive resin is applied to the space between a process cylinder and a rigid plate which is transparent to actinic light. Relative movement is provided between the cylinder and the plate perpendicular to the longitudinal axis of the cylinder, while the cylinder is rotated in synchronization with the relative movement of the rigid plate to evenly spread the photosensitive resin. The photosensitive resin is simultaneously exposed in the space between the cylinder and rigid plate.

14 Claims, 6 Drawing Figures

METHOD AND APPARATUS FOR MANUFACTURING SEAMLESS PRINTING ROLL

BACKGROUND OF THE INVENTION

The present invention relates to printing plates and more particularly to a method of manufacturing a seamless cylindrical printing plate (hereinafter referred to as "a seamless printing roll" when applicable) and an apparatus for practicing the method.

In the case where continuous patterns are printed on wall paper, packing paper or the like, the pictures or patterns of a printing plate on a plate cylinder must be made continuous so that the pictures or patterns appear natural and uninterrupted. In order to accomplish the necessary fine printing operation, heretofore a layer of rubber or polyvinyl chloride was wound around the cylinder and was engraved manually or a rubber printing plate produced by casting was bonded in the form of waves to the cylinder with care that the picture or pattern was not cut but was continuous. However, these conventional methods are disadvantageous in that such methods require much skill in implementation, the patterns are limited, and it takes a long time to produce such a printing roll.

In order to overcome such difficulties, a variety of seamless printing roll manufacturing methods and apparatuses utilizing photosensitive resin printing plates have been proposed in the art. For instance, in a conventional elementary method, a flat printing plate is formed, the flat printing plate is wound around a plate cylinder, and both ends of the printing plate thus wound are joined together by using, for instance, an adhesive agent. (See, for example, Japanese Laid Open Patent Application Nos. 143404/1978 and 29804/1978). However, this method is disadvantageous in that if the joining portions of the printing plate are intricate, the joining operation can be considerably troublesome and, if the two ends of the printing plate are unsatisfactorily joined together, the printing plate may become detached from the plate cylinder during the printing operation at the joined portion. It should be noted that in this method the resin printing plate merely takes the place of a conventional cast rubber printing plate and that therefore the technique for manufacturing the seamless printing roll is fundamentally the same as the conventional one.

In addition, a method is known with which photosensitive resin is applied directly to a cylinder used as a plate cylinder and the layer of photosensitive resin on the cylinder forms a seamless printing roll. (See, for example, Japanese Patent Publication No. 28042/1977, and Japanese Laid Open Application Nos. 60301/1975, 90404/1975, 62503/1977 and 145703/1978 which relates mainly to coating techniques; and Japanese Patent Application Publication No. 42451/1971 and Japanese Laid Open Patent Application Nos. 504/1977 and 77406/1976 which relates mainly to exposure techniques).

In any of these methods, a photosensitive layer is formed on a cylinder by applying thereto a photosensitive material which is produced by heating solid-state photosensitive thermoplastic resin or dissolving the material in a solvent, or by applying a photosensitive resin solution thereto. The photosensitive layer is then placed in semi-hardened state by subjecting it to exposure. In other words, in such methods, a photosensitive layer is formed on a cylinder and then the photosensitive layer thus formed is exposed through a negative or positive film. In order to manufacture a seamless printing roll according to these methods, two manufacturing steps, a step of forming the photosensitive layer and a step of exposing the photosensitive layer to light, are required. Thus, in view of both total effort required and economy, these methods are low in efficiency.

In addition, as a result of the development of laser beams, a method of manufacturing a seamless printing roll utilizing laser beams has been proposed. However, in order to practice this technique, it is necessary to use an extremely expensive apparatus and accordingly a seamless printing roll manufactured by the apparatus is necessarily high in cost. With respect to the image reproducibility on such a printing roll, it is rather difficult to provide the reproducibility equivalent to that of the conventional cast printing plate. Thus, the method has not been completely accepted as yet.

In addition, printing of a continuous pattern is carried out by employing a photogravure roll. However, with the advent of light sensitive resin plate, gravure printing is gradually being abandoned in favor of relief printing because the production of a gravure roll is costly and may cause a heavy metal effluent.

Accordingly, an object of this invention is to eliminate the above-described difficulties accompanying conventional methods. More specifically, an object of the invention is to provide a seamless printing roll manufacturing method and apparatus in which a photosensitive layer is formed and exposed to light simultaneously in a single process thereby to readily and quickly to form a seamless printing roll which is accordingly low in cost.

SUMMARY OF THE INVENTION

In accordance with the invention, there is provided a seamless printing roll manufacturing method in which a photosensitive layer is formed to a predetermined thickness on a process cylinder and is simultaneously subjected to an image-forming exposure operation, and a liquid-type photosensitive resin is supplied into the space between a rigid plate which is transparent to actinic light and the process cylinder. While the cylinder is rotated in synchronization with the relative movement of the rigid plate with respect to the rotary shaft of the cylinder with the distance maintained unchanged, the photosensitive layer is exposed in the space.

Furthermore, in accordance with the invention there is provided a seamless printing roll manufacturing apparatus which includes a rigid plate transparent to actinic light, a light source provided on one side of the rigid plate, and means for supporting a process cylinder, the means being provided on the other side of the rigid plate, the space between the rigid plate and the cylinder being adjustable, and which further includes means for exposing a photosensitive layer in the space while rotating the process cylinder in synchronization with the relative movement speed of the rigid plate with respect to the rotary shaft of the process cylinder whereby the photosensitive layer is formed to a predetermined thickness and is simultaneously exposed.

Moreover, the invention is intended to provide a method for placing an image carrier on the rigid plate of the aforementioned apparatus in which in order to bring the image carrier in close contact with the rigid plate which is transparent to actinic light, an image carrier transfer cylinder whose radius is substantially equal to the radius of a printing roll to be manufactured is provided. After the image carrier is wound around the image carrier transfer cylinder in correct alignment by reference to suitable registering marks, the image carrier transfer cylinder is placed in abutment against the rigid plate so that an overlapping portion of the image carrier wound around the cylinder is in close contact with the rigid plate and the image carrier is transferred to the rigid plate by rotating the cylinder and by the relative motion of the cylinder with respect to the rigid plate.

A method is known in the art in which a photosensitive layer is formed to a predetermined thickness by using a liquid-type photosensitive resin and the photosensitive layer thus formed is exposed thereby to provide a flat printing plate (see, for example, Japanese Patent Application Publication No. 42452/1971). In contrast with this prior art method, with the invention, a photosensitive layer is formed to a predetermined thickness on a process cylinder and is simultaneously exposed thereby providing for the ready and inexpensive manufacture of a seamless printing roll.

With the invention, the process cylinder is used for applying photosensitive resin and to expose the resin, and for ordinary printing after suitable treatment. Accordingly, any cylinder can be used as the process cylinder if its material and construction are such that the photosensitive resin will adhere thereto. For instance, a simple metal cylinder can be used. Furthermore, a metal cylinder on which an adhesive layer is formed, or a metal cylinder on which a base layer is formed, or a metal cylinder on which both an adhesive layer and a base layer are formed can be utilized as the process cylinder. Instead of such a metal cylinder, a plastic cylinder can be used. In this case, a cylindrical plastic sleeve integral with a shaft can be used. Among the above described process cylinders, a process cylinder produced by forming an adhesive layer and a base layer on a cylinder is most suitable to increase its adhesive power for adhering the photosensitive resin thereto. It is preferable that the base layer be of a resin which is the same as the photosensitive resin to be used for image forming exposure or equal in polymer segment to the photosensitive resin. Before the adhesive layer or the base layer is formed on the cylinder, it is desirable to roughen the cylindrical surface of the cylinder so that the layer is positively stuck to the cylinder. This method should be employed especially when a metal cylinder is used as the process cylinder.

Incidentally, if necessary, a halation preventing layer is formed on the process cylinder in order to reduce the quality degradation of the reproducing image corresponding to the reversed patterns in solid clear portion and the fine patterns of an image carrier, depending upon light sensitive characteristics of the light-sensitive resin used, relief depth, and printing pattern. The halation preventing layer may be provided by coating anti-transparent or semi-anti-transparent materials to the actinic light on the process cylinders. Alternatively, such materials may be previously added into the adhesion layer or base layer.

The liquid-type photosensitive resin which can be employed in the invention is a photopolymerizable composition which comprises one or more kinds of addition-polymerizable unsaturated compounds and a photopolymerization initiator as described below, and if desired, a heat polymerization inhibitor, a binder, a filler or other additives may further be added to the composition. There is no particular limitation concerning kinds of resin compositions so long as the resin compositions harden upon irradiation of actinic light, but the resin composition has preferably the viscosity of not less than about 1000 cps (measured by a B type viscosimeter) at a temperature of 20° C. When the photosensitive resin is used in a vertical-type apparatus, it is particularly preferable that its viscosity be about 3000 cps or more.

The addition-polymerizable unsaturated compounds which can be used are compounds having an addition-polymerizable carbon-carbon double bond such as a vinyl group, a vinylidene group, a fumaroyl group, a maleoyl group, etc.

Suitable examples of the addition-polymerizable unsaturated compounds include unsaturated carboxylic acids such as acrylic acid and methacrylic acid and esters thereof such as an alkyl, cycloalkyl, halogenated alkyl, alkoxyalkyl, hydroxyalkyl, aminoalkyl, tetrahydrofurfury, alkyl, glycidyl, benzyl, or phenoxy acrylate and methacrylate, a mono- or di(meth)acrylate of an alkylene glycol, polyoxyalkylene glycol, trimethylolpropane tri(meth)acrylate, pentaerythritol tetra(meth)acrylate, etc.; acrylamide, methacrylamide and derivatives thereof such as an N- or N,N'-alkyl (or hydroxyalkyl) substituted acrylamide and methacrylamide, diacetone acrylamide and methacrylamide, an N,N'-alkylane-bis(meth)acrylamide, etc.; allyl compounds such as allyl alcohol, allyl isocyanate, diallyl phthalate, triallyl cyanurate, etc.; maleic acid, maleic anhydride, fumaric acid and esters thereof such as an alkyl, halogenated alkyl or alkoxyalkyl mono- or dimaleate or fumarate, etc.; other unsaturated compounds such as styrene, vinyltoluene, divinylbenzene, N-vinyl-carbazol, N-vinylpyrrolidone, etc.; unsaturated polyesters or alkyds such as polyesters of an unsaturated dibasic acid or its anhydride (e.g., maleic acid, fumaric acid and itaconic acid) and a polyalcohol (e.g., ethylene glycol, propylene glycol, dietylene glycol, triethylene glycol, glycerin, trimethylolpropane, pentaerythritols and 1,4-polybutadiene, hydrogenated or nonhydrogenated 1,2-polybutadiene or a copolymer of butadiene and styrene or acrylonitrile, having a terminal hydroxy group), polyesters having partially substituted with a saturated polybasic acid (e.g., succinic acid, adipic acid, phthalic acid, isophthalic acid, phathalic anhydride and trimellitic acid) for the acid components described above, polyesters modified with a drying oil fatty acid or a semi-drying oil fatty acid, etc.; unsaturated polyurethanes, i.e., produced by introducing an addition-polymerizable unsaturated group into a polyol having two or more terminal hydroxy groups bonding with a polyisocyanate via an urethane linkage utilizing a terminal isocyanate group or hydroxy group of the compound such as a polyurethane of a polyol (e.g., polyalcohol, polyester polyol, polyether polyol and 1,4-polybutadiene, hydrogenated or non-hydrogenated 1,2-polybutadiene or a copolymer of butadiene and styrene or acrylonitrile, having a terminal hydroxy group) with a polyisocyanate (e.g., toluylene diisocyanate, diphenylmethane-4,4'-diisocyanate and hexamethylene diisocyanate) having an unsaturated group introduced utilizing the reactivity of the terminal isocyanate group or hydroxy group of the polyurethane, namely a compound having an unsaturated group introduced by the reaction of the isocyanate group with an unsaturated carboxylic acid or its ester having active hydrogens such as a hydroxy group, a carboxy group or an amino group among the unsaturated carboxylic acids and ester thereof described above, or by the reaction of the hydroxy group with those having a carboxyl group, or a compound linking an unsaturated polyester as described above with a polyisocyanate, etc; oligoester acrylates having a molecular weight of about 200 to about 5,000 produced by copolycondensating acrylic acid or methacrylic acid introduced in an ester reaction system of polybasic acids and polyalcohols while controlling the molar ratio of the reactions, such as a condensating acrylic acid or methacrylic acid in an ester reaction system of adipic acid, phthalic acid, isophthalic acid or anhyrides thereof and polyalcohols (e.g., ethylene glycol, propylene glycol, diethylene glycol, triethylene glycol, glycerin and trimethylolpropane, pentacrythritol), epoxy acrylates such as acrylates or methacrylates of an epoxy group containing compounds produced by a polycondensation reaction of a polyalcohol or a polyphenol with epichlorohydrin or an alkylane oxide; high molecular weight compounds having an addition-polymerizable carbon-carbon double bond in its side chain such as those produced by reacting a high molecular weight compound having a hydroxy group (e.g., polyvinyl alcohol and cellulose) with an unsaturated carboxylic acid or anhydride thereof, those produced by ester-bonding of a high molecular weight compound having a carboxy group (e.g., polymers or copolymers of acrylic acid or methacrylic acid) with an unsaturated alcohol or glycidyl acrylate or methacrylate, reaction products of a copolymer containing maleic anhydride with allyl alcohol or a hydroxyalkyl acrylate or methacrylate, etc.; reaction products of acrylic acid or methacrylic acid with a copolymer containing glycidyl acrylate or methacrylate as copolymerizable component; and the like.

The term "rigid plate transparent to actinic light" as herein used is intended to mean a rigid material which allows actinic light having a wave length capable of hardening the photosensitive resin to pass therethrough and which is not deformed non-elastically even if it is repeatedly used at a temperature below 80° C. Examples of such a rigid plate are organic glass plates of organic platics material such as an acryl plate, a methacryl plate, a polypropylene plate and polyethylene plate, or inorganic glass plates such as soda glass plates, quartz glass plates and pyrex glass plates. However, ordinary inorganic glass plates are most suitable. Since the accuracy in thickness of a seamless printing roll manufactured according to the invention depends on the accuracy in planeness of the rigid plate, it is essential to use a rigid plate whose thickness is high in accuracy.

After the photosensitive layer is exposed to light to form an image thereon and is hardened, it may be sometimes difficult to peel it off the rigid plate depending on the type of rigid plate employed. This difficulty can be eliminated by forming on the rigid plate a layer which permits the hardened photosensitive layer to readily peel off the rigid plate. That is, the layer can be formed by lightly applying a release agent of silicon resin or fluorocarbon resin to the surface of the rigid plate.

In the case where the image carrier is brought into close contact with the rigid plate surface confronting the process cylinder so that the photosensitive layer is subjected to image forming exposure, formation of the special layer permitting the hardened photosensitive layer to readily peel off the rigid plate is unnecessary. Accordingly, in general, it is preferable that the image carrier be placed as described above and the photosensitive layer is subjected to an image forming exposure. In the case where the image forming exposure is carried out with the image carrier in close contact with the surface of the rigid plate which is on the side of the light source, it is necessary to apply an actinic light beam as parallel as possible to the space between the process cylinder and the rigid plate. This is essential especially to manufacture a printing roll having a fine pattern.

Furthermore, according to another aspect of the invention, if a spot light source having excellent focusing characteristics is moved in parallel with the process cylinder or if a slit-like small hole provided between the light source and the rigid plate is moved in parallel with the process cylinder to expose the photosensitive layer to light, then an image can be formed. That is, a seamless printing roll can be produced without using an image carrier.

The term "image carrier" as herein used is intended to mean a material which has a region transparent to the actinic light. Examples of such an image carrier are negative or positive photographic films and films with handwritten patterns.

The invention will be described in detail with reference to the accompanying drawings.

DESCRIPTION OF THE PREFERRED EMBODIMENTS

Figure 2:
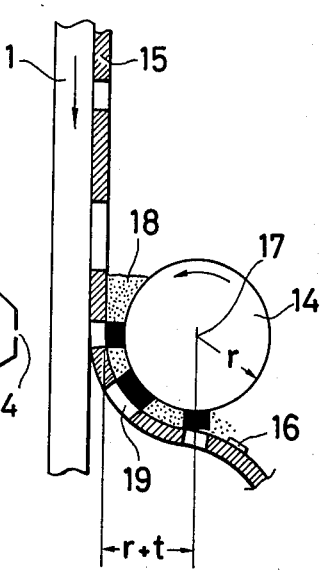
FIG. 2 is an explanatory diagram showing a method of mounting the cylinder of FIG. 1.

First, a seamless printing roll manufacturing method according to the invention will be described. As shown in FIG. 2, a slit 4 and a light source 3 are provided on one side of a rigid plate 1 such as a glass plate while on the other side there is disposed a negative or positive film 15 which has been brought into close contact with the glass plate 1. A process cylinder 14 is mounted on a bearing 8 adapted to support the process cylinder with a clearance t between the film and the process cylinder 14. The above-described elements 3, 4 and 8 are in a plane substantially perpendicular to the glass plate 1. Then, while a liquid photosensitive resin 18 is supplied into the clearance space between the glass plate and the process cylinder, the process cylinder 14 is rotated so that the glass plate 1 and the film 15 are moved in the direction of the arrow with respect to the light source 3, slit 4 and cylinder 14. As a result, a photosensitive layer is formed on the cylinder 14 to a predetermined thickness t, while the photosensitive layer on a transparent portion of the film 15 is optically hardened by actinic light irradiated through the slit 4 from the light source whereby an image corresponding to the hardened portion 19, is formed. Thus, after the cylinder 14 makes one revolution, a seamless printing roll is produced.

Figure 1:
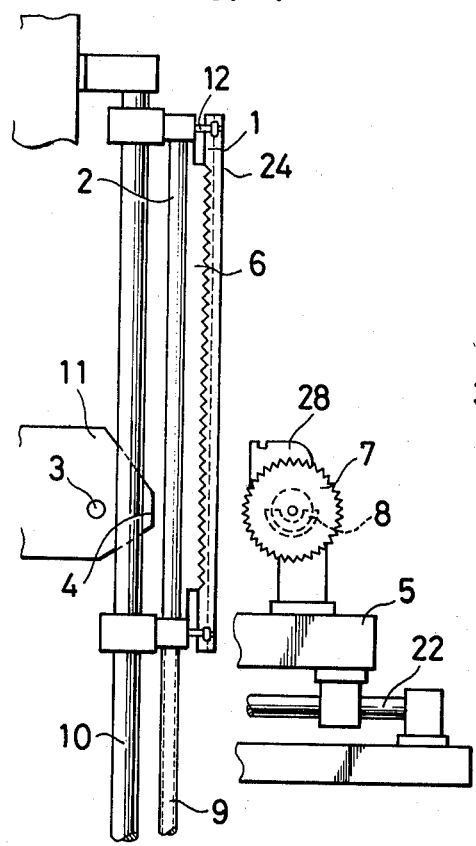
FIG. 1 is a side view of one example of an apparatus according to the invention.
Figure 3:
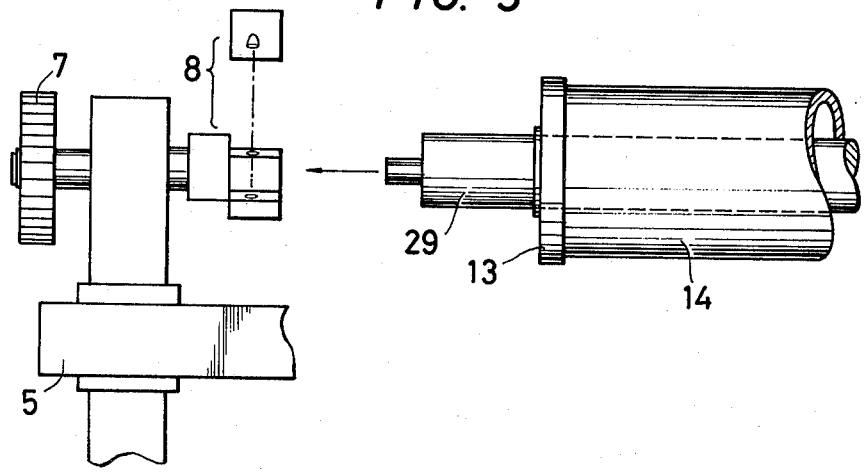
FIGS. 3, 4 and 6 are explanatory diagrams for a description of the method according to the invention.

Next, a seamless printing roll manufacturing apparatus according to the invention will be described. In FIGS. 1, 2 and 3, the rigid plate, for example, the glass plate 1, is moved in a direction perpendicular to the axial direction of the rotary shaft 17 of the process cylinder. The cylinder 14 is operated in association with the glass plate 1 so that the speed of the relative motion is equal to the circumferential speed of a circle with radius of r+t where r is the radius of the cylinder.

However, two different relative motions are possible with the invention. That is, in one relative motion the glass plate 1 is moved but the translational positions of the cylinder 14, light source 3 and slit 4 are stationary while in the other relative motion the position of the glass plate 1 is stationary but the other elements are moved in a translational motion. In this connection, it should be noted that the elements 3, 4 and 17 lie in a plane substantially perpendicular to the surface of the glass plate 1. In the apparatus, the angle $\theta$ between the surface of the glass plate 1 and the horizontal line can be selected as desired within the range of $0° \leq \theta \leq 90°$. The above-described relative motions and the orientation of the glass plate may be combined as desired. However, in order to simplify the construction of the apparatus, prevent a rigid plate from bending, and to produce a printing roll having a greater thickness, it is preferable that the apparatus be so designed that the glass plate 1 is positioned upright ($\theta=90°$) and that it is moved vertically as shown in FIG. 1.

A variety of methods of moving the glass plate in association with the cylinder 14 can be utilized. In one of those methods as shown in FIG. 1, a rack 6 is provided on a frame 2 which secures glass plate 1 in such a manner that the rack 6 is parallel with the frame, a pinion 7 is coaxially mounted on the cylinder bearing 8 supporting the cylinder, and the rack is engaged with the pinion. In another method, the cylinder, or an auxiliary ring coaxially arranged in place of the cylinder, is rolled along the above-described frame without slippage. The most generally applicable method is the above-described rack and pinion interlocking method. In addition to the above-described motion, the cylinder bearing 8 supporting the process cylinder 14 can slide along a line perpendicular to the surface of the glass plate.

Described below is a method for maintaining constant the distance t between the film 15 and the cylinder 14 during formation and exposure of the photosensitive layer. For instance, a flange 13 having a radius r+t is coaxially provided on each end of the cylinder 14 or a spacer having a thickness t is provided on the circumference of each end portion of the cylinder, or spacers each having a thickness t are provided on both ends in parallel with the direction of the exposure light for the film 15 in close contact with the glass plate 1 so as to maintain the distance t constant at all times. Maintaining the distance t constant is important for maintaining the thickness accuracy of the seamless printing roll. The distance t can be readily maintained constant by providing the above-described flanges 13 or spacers on the cylinder 14. The flange 13 is semipermanently or detachably fixed to the process cylinder. However, it is preferrable in terms of production speed to detachably fix the flange to the cylinder and to re-use the cylinder. The value of t is not particularly limited; however, a suitable value for the distance t is of the order of 0.1 to 10 mm, and practically of the order of 0.2 to 5 mm in view of the relief depth of the printing roll.

The glass plate 1 is fixedly secured to a glass frame 24 which is in turn fixedly secured by means of bolts 23 and springs 12 to the frame 2 adapted to move the glass plate. Generally, in case of the fixing the glass plate 1 to the frame 2, it is preferable to fix the plate 1 to the frame 2 through stretchable elastic or resilient members such as springs or rubber components as above-mentioned in order to prevent the glass plate from being subjected to an unsustainable load during operation and to easily provide a constant distance between the process cylinder and the glass plate.

The frame 2 is so designed that it can slide vertically along guide rods 10. In order to transmit the vertical motion of the glass plate to the process cylinder 14, racks 6 are provided on the right and left sides of the frame 2. Threaded rods 9 are rotated by a drive source as a result of which the frame 2 is slid along the guide rods 10. This vertical motion of the frame 2 is transmitted to the cylinder 14 through the rack and the pinion 7 which is coaxially coupled through the bearing 8 to the cylinder 14 thereby to rotate the process cylinder 14. The pinion 7 and the bearing 8 are provided on a cylinder table 5 which can slide along a rod 22 with respect to the glass plate 1. It is necessary to lock the table so that during operation the rack accurately engages the pinion and the distance t between the cylinder and the film 14 is maintained unchanged. The table can be locked by a pneumatic means utilizing compressed air or by a spring means. However, the operation can be simplified by the utilization of the pneumatic means. The light source 3 is disposed in parallel with a rotary shaft of the cylinder, and the glass plate is positioned between the light source 3 and the cylinder 14. The slit 4 is provided between the glass plate 1 and the light source 3. A light shielding board 11 is provided so that light from the light source reaches the cylinder only through the slit. It is preferable that the width of the opening of the slit be variable so as to control the quantity of light. A more parallel light beam can be applied to the photosensitive layer by providing a grid-shaped frame at the slit opening in front of or behind the slit opening. A variety of light sources such as for instance a light source such as that employed in a photosensitive resin plate exposing machine may be used as the light source of the device according to the invention. However, the light source must be such that light reaching the surface of the glass plate is uniformly distributed at least over the width of the cylinder or the light source must be so arranged to accomplish this effect.

Figure 6:
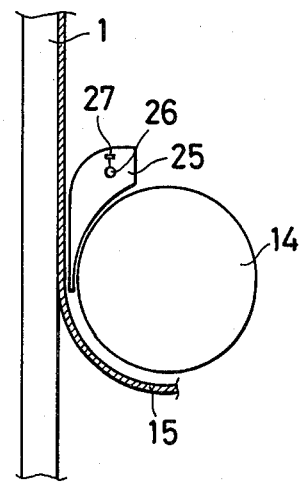
Figure 5:
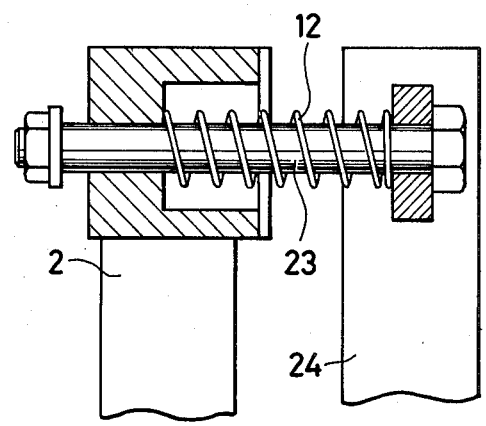
FIG. 5 is an explanatory diagram showing a method of mounting the rigid plate.

Now an example of a procedure for manufacturing a seamless printing roll using the device shown in FIG. 1 will be described. First, according to the method of the invention, the film 15 is brought in close contact with the glass plate 1 after which a sheet 16 is bonded to the film in such a manner that it is 2 to 3 cm below the lower portion of an image region and extends horizontally. The sheet 16 has a width of about 5 mm, while the thickness of the sheet 16 is substantially equal to the distance t. This is to prevent the photosensitive resin 18 from flowing downwardly since the device is of the vertical orientation type. Thereafter, the shaft 29 of the process cylinder 14 is mounted on the cylinder bearings 8. FIG. 3 shows one example of the device in which the process cylinder 14 is detachably combined with the shaft 29. However, the cylinder 14 and the shaft 29 may be manufactured as one unit. Next, the cylinder table 5 is slit so that the pinions at both ends of the cylinder are accurately engaged with the respective racks. The glass plate is moved so that the lower portion of the film is positioned below the cylinder. Then, the lower portion of the film is attached to the lower portion of the cylinder with adhesive tape and a guide spacer 25 is inserted between the film 15 and the cylinder 14 to prevent leakage of the resin as shown in FIG. 6. Thereafter, a suitable quantity of photosensitive resin is supplied to the space between the film 15 and the cylinder 14, the light source 3 is turned on, and the drive source is operated. As a result, the glass plate 1 moves downwardly. As the glass plate 1 moves downwardly, the cylinder 14 rotates whereby an image having a relief depth t is formed.

When the cylinder has made one complete revolution, the exposure is suspended resulting in a seamless printing roll. Thereafter, the cylinder is removed and is then subjected to an after-treatment such as development, and, if necessary, after-exposure, drying and surface treatment. In the case where a fixed-type flange is employed, a seamless printing roll which can be loaded on the printing machine can be obtained by scraping the outer circumferential portions of the flange 13 by a thickness of about t. In the case where, in order to prevent leakage of resin not hardened and to uniformly peel the film off the glass plate, a stripe-shaped transparent region is provided about 1 cm above the sheet 16 which has been bonded to the film 15, to thereby form a stripe image on the cylinder, it is necessary to remove the stripe image with a knife or the like before the cylinder completes one revolution.

During the exposure, the temperature of the glass plate is increased by the heat of the light source and by the heat of polymerization of the photosensitive resin. Therefore, it is desirable to cool the glass plate with cooling air.

The time required for forming and exposing the photosensitive layer per cylinder, that is, the time required for manufacturing a seamless printing roll depends on the cylinder diameter, pattern, relief depth, and photosensitivity. of the photosensitive resin used. For instance in the case where the cylinder diameter is 163 mm, the relief depth is 0.5 to 1.2 mm and the pattern is of an ordinary wall paper, a seamless printing roll can usually be manufactured in about 30 to 90 minutes. Thus, it is understood that a device according to the invention can be used to manufacture a seamless printing roll in a much shorter period of time than a device of the prior art.

Next, a method of transferring the image carrier to the rigid plate such as a glass plate of the seamless printing roll manufacturing apparatus according to the invention will be described. In the case where a seamless printing roll is manufactured using an image carrier, the most important step in the preparation of the finished roll to correctly place the image carrier on the glass plate. The method of placing an image carrier on the rigid plate of the apparatus according to the invention can be readily achieved.

Figure 4:
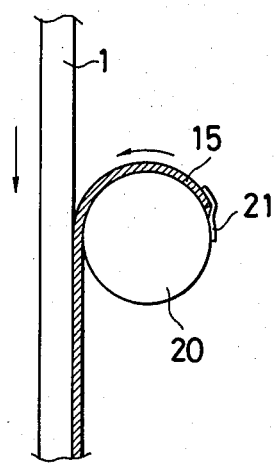

The method will be described with reference to FIG. 4. First, a film transfer cylinder 20 whose radius is substantially equal to the radius r+t of a seamless printing roll to be manufactured is prepared. Then, the cylinder 20 is mounted on the bearings 8. Thereafter, an image carrier having a pattern to be formed on the cylinder is partially laid over or wound around the cylinder using suitable registration marks provided at at least four corners thereof. Then, the laid over portion of the image carrier thus wound around the cylinder confronts the glass plate and the cylinder is slid so that the image carrier is brought into close contact with the glass plate. Under this condition, the drive source is operated, as a result of which the glass plate moves downwardly, so that the image carrier is gradually transferred from the image carrier transfer cylinder to the glass plate.

At least the cylindrical surface of the image carrier transfer cylinder should be made of an elastic material such as rubber so that the image carrier may not be scratched and may be brought completely in close contact with the glass plate. For instance, the cylindrical surface of a metal cylinder should be covered with a rubber layer of about 10 mm in thickness. It is desirable that the hardness of the elastic rubber material be in the range of 50° to 90° (Shore A hardness). If the surface of the glass plate is uniformly and lightly coated with a transparent adhesive agent in advance, then the image carrier can be more completely brought into contact with the glass plate. The adhesive power of the adhesive agent is such that, after exposure, the image carrier can be smoothly peeled off the glass. According to the above-described method, the image carrier can be accurately placed on the glass plate of the seamless printing roll manufacturing apparatus.

As is apparent from the above-described, in the invention, the photosensitive layer is formed and exposed to light simultaneously and accordingly a seamless printing roll can be readily and quickly manufactured. Furthermore, the printing roll thus manufactured is accurate and constant in thickness. Typically, the thickness accuracy is within 2/100 mm of true circularity. Therefore, as a printing machine has an excellent in accuracy, fine printed matter can be produced. Thus, the invention can provide seamless printing roll suitable for printing wall paper, packaging paper or the like.

According to the present invention, a synthetic resin roller can be produced as in the same manner as those for producing seamless printing rolls having a solid surface. Therefore, rollers for laser engraving, manual engraving, and ink rollers as well as those rollers used other than printing can readily be produced by employing light-sensitive resin having suitable physical and chemical characteristics. Further, it goes without saying that the synthetic resin roller for use in embossing can be similarly produced.

Even if a cylinder on which a photosensitive layer has been formed already is used, the photosensitive layer can be suitably exposed with the manufacturing apparatus and the image carrier placing method according to the invention so as to obtain a seamless printing roll.

What is claimed is:

1. A method in which a photosensitive layer is formed on a process cylinder to a predetermined thickness and simultaneously subjected to image-forming exposure for manufacturing a seamless printing roll comprising the steps of supplying a photosensitive liquid-type resin to the space between a process cylinder and a rigid plate which is transparent to actinic light, providing a relative translational movement between said rigid plate and a rotational axis of said cylinder, simultaneously rotating said cylinder in synchronization with said translational movement, and, exposing said photosensitive layer in said space.

2. The method as claimed in claim 1 in which said exposing step comprises exposing said photosensitive layer through an image carrier placed on said rigid plate, said image carrier being transparent to said actinic light.

3. The method as claimed in claim 2 in which said image carrier and said process cylinder are provided on the same side of said rigid plate.

4. The method as claimed in claim 1 in which said rigid plate transparent to said actinic light is positioned vertically and said photosensitive layer is formed and exposed simultaneously.

5. The method as claimed in claim 1 in which fixed or detachable type flanges are provided at both ends of said process cylinder in such a manner that said flanges are coaxial with said cylinder.

6. The method as claimed in claim 1 in which spacers are provided on both end portions of the cylindrical outer surface of said cylinder.

7. The method as claimed in claim 1 in which said actinic light is irradiated through a slit before reaching said photosensitive layer.

8. The method as claimed in claim 1 in which said actinic light is irradiated through a grid-shaped frame.

9. The method as claimed in claim 1 in which the viscosity of said liquid-type photosensitive resin is at least 3000 cps at a temperature of 20° C.

10. The method as claimed in claim 1 in which said process cylinder comprises an adhesive layer and a base layer on a cylinder.

11. The method as claimed in claim 1 in which said process cylinder comprises an adhesive layer and a base layer on a cylinder having a roughened surface.

12. The method as claimed in claim 1, wherein halation preventing layer is formed on a peripheral surface of said process cylinder.

13. The method as claimed in claim 1 further comprising the steps of winding an image carrier being partially laid over around an image carrier transfer cylinder whose radius is substantially equal to the radius of printing roll to be manufactured in alignment with registration marks, placing said image carrier transfer cylinder in abutment with said rigid plate so that a laid over portion of said image carrier wound around said image carrier transfer cylinder is in close contact with said rigid plate, and transferring said image carrier to said rigid plate by relative motion of said image carrier transfer cylinder with respect to said rigid plate.

14. The method as claimed in claim 13 in which at least the cylindrical surface of said image carrier transfer cylinder is made of elastic rubber material.

* * * * *